(12) United States Patent
Huang

(10) Patent No.: US 6,406,987 B1
(45) Date of Patent: Jun. 18, 2002

(54) METHOD FOR MAKING BORDERLESS CONTACTS TO ACTIVE DEVICE REGIONS AND OVERLAYING SHALLOW TRENCH ISOLATION REGIONS

(75) Inventor: Jenn Ming Huang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/149,258

(22) Filed: Sep. 8, 1998

(51) Int. Cl.[7] .............................................. H01L 21/22

(52) U.S. Cl. ...................... 438/595; 438/303; 438/586

(58) Field of Search ................................ 438/637, 424, 438/586, 595, 598, 303, 199

(56) References Cited

U.S. PATENT DOCUMENTS

| | | | | |
|---|---|---|---|---|
| 4,735,680 A | * | 4/1988 | Yen | 156/643 |
| 4,944,682 A | | 7/1990 | Cronin et al. | 437/192 |
| 4,981,813 A | | 1/1991 | Bryant et al. | 437/73 |
| 5,173,444 A | | 12/1992 | Kawamura | 437/69 |
| 5,433,794 A | | 7/1995 | Fazan et al. | 148/33.3 |
| 5,651,857 A | | 7/1997 | Cronin et al. | 156/644.1 |
| 5,652,176 A | | 7/1997 | Maniar et al. | 437/67 |
| 5,780,348 A | * | 7/1998 | Lin et al. | 438/303 |
| 5,783,475 A | * | 7/1998 | Ramaswami | 438/303 |
| 5,972,774 A | * | 10/1999 | Matumoto | 438/435 |

OTHER PUBLICATIONS

Cy Chang et al. "ULSI Technology", The McGraw Hill Companies, 1996, p. 446–447.
K. Noda et al. "A 2.9 $\mu m^2$ Embedded SRAM Cell with Co–Salicide Direct Technology for 0.18 $\mu n$ High Performance CMOS Logic" Strap, IEDM '97 of IEEE, p 847–850.

* cited by examiner

Primary Examiner—Kevin M. Picardat
(74) Attorney, Agent, or Firm—George O. Saile; Stephen B. Ackerman

(57) ABSTRACT

A method for making borderless contacts to source/drain areas that overlap the STI is achieved. The method reduces contact shorts between the source/drain and the substrate, and eliminates erosion of the gate oxide to prevent gate/drain shorts. The method involves forming trenches in a silicon substrate, which are filled with a silicon oxide ($SiO_2$) and etched back to form STI surrounding and electrically isolating device areas. The STI is essentially planar with the substrate surface. A gate oxide is formed on the device areas and a polysilicon or polycide layer is patterned to form FET gate electrodes. A first silicon nitride ($Si_3N_4$) layer is deposited and etched back to form sidewall spacers on the gate electrodes. The STI is recessed using a dip etch. A thin stress-release oxide is formed and a second $Si_3N_4$ layer is deposited and etched back to form visors (protective coverings) on the exposed sidewalls of the trench. An interlevel dielectric is deposited and borderless contact openings that extend over the STI can now be etched to the active device areas to provide improved circuit density. When metal plugs are formed in the contact openings, the visor protects the source/drain contacts and the underlying substrate from electrical shorting.

30 Claims, 9 Drawing Sheets

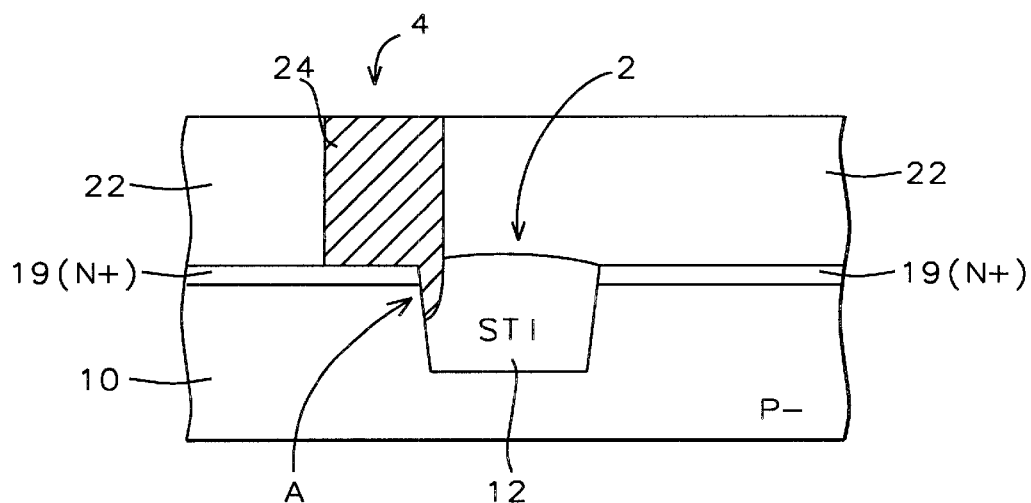
FIG. 1 – Prior Art
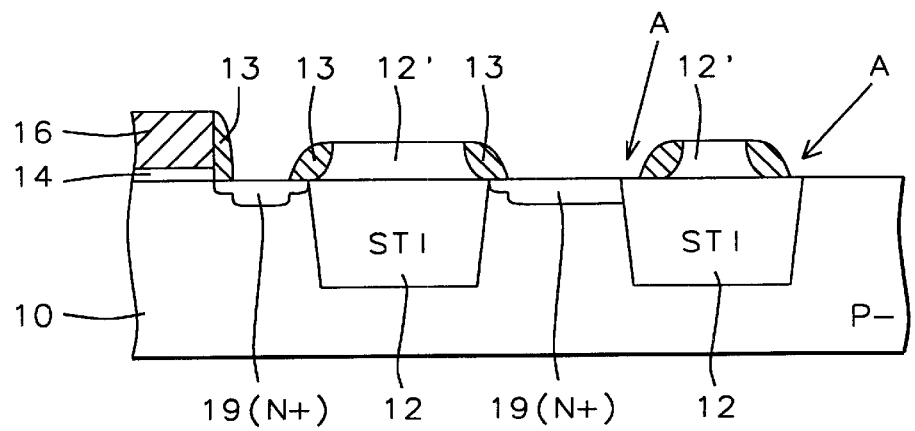
FIG. 2 – Prior Art

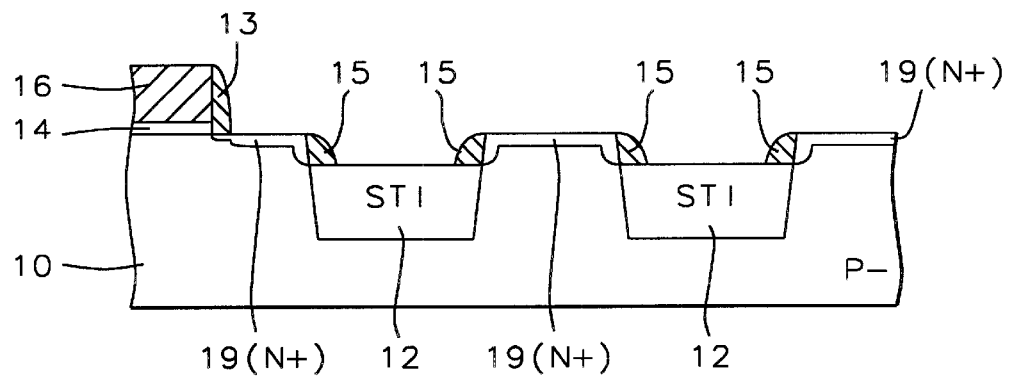
FIG. 3 – Prior Art
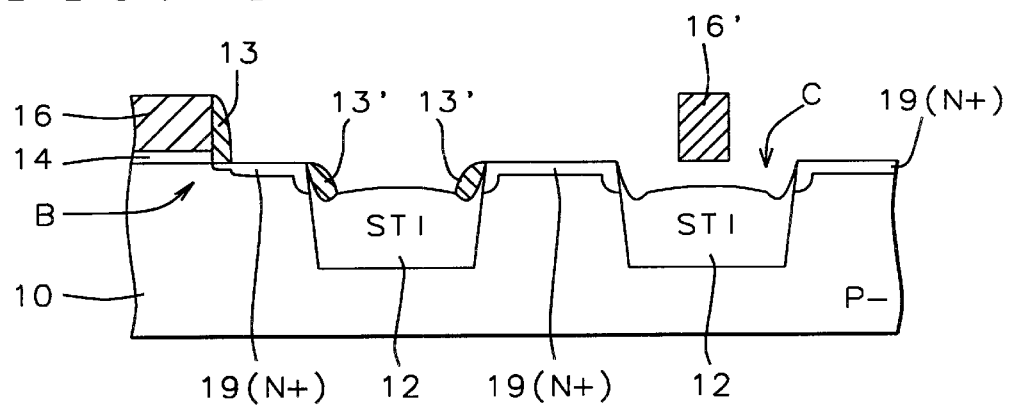
FIG. 4 – Prior Art
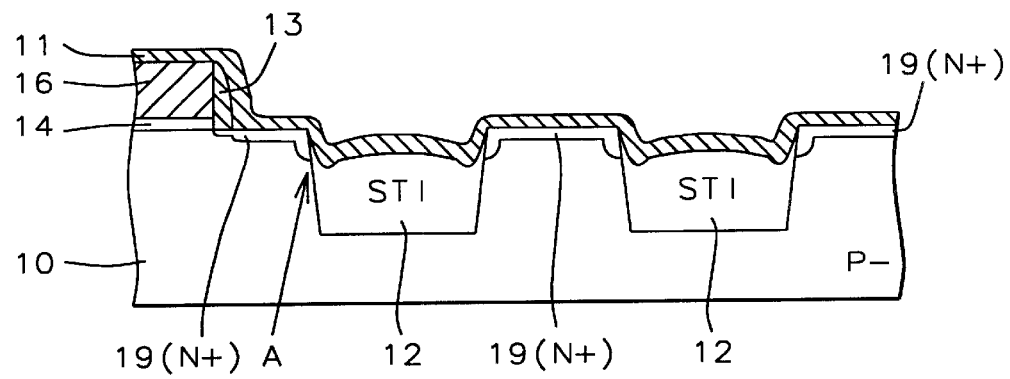
FIG. 5 – Prior Art

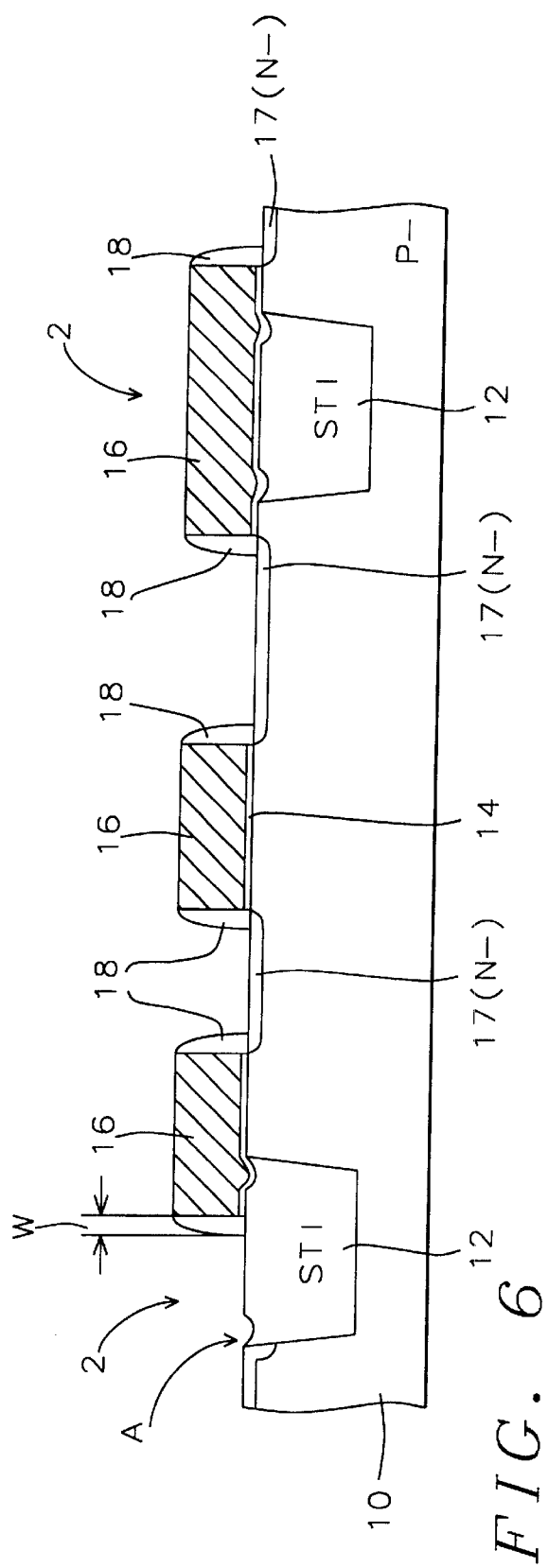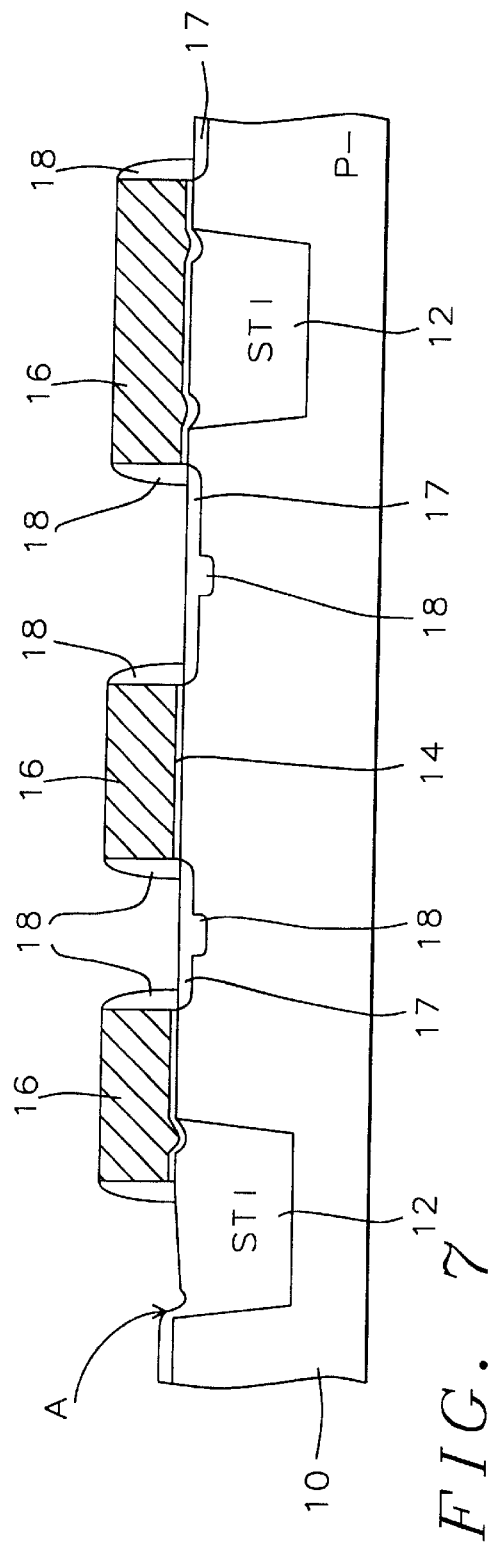

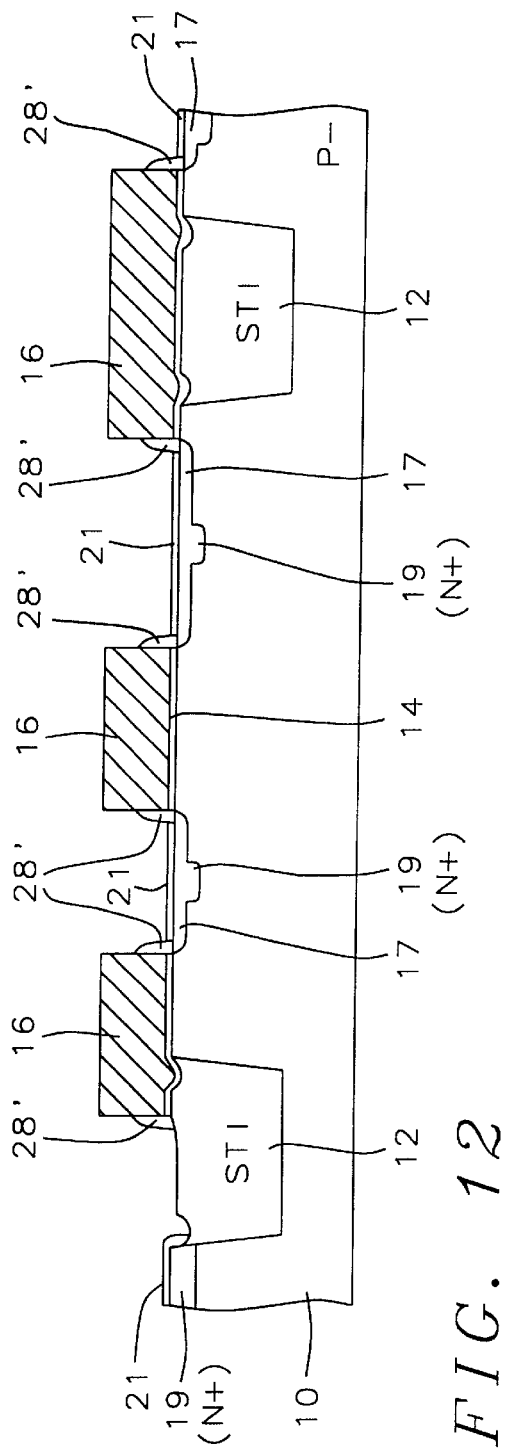
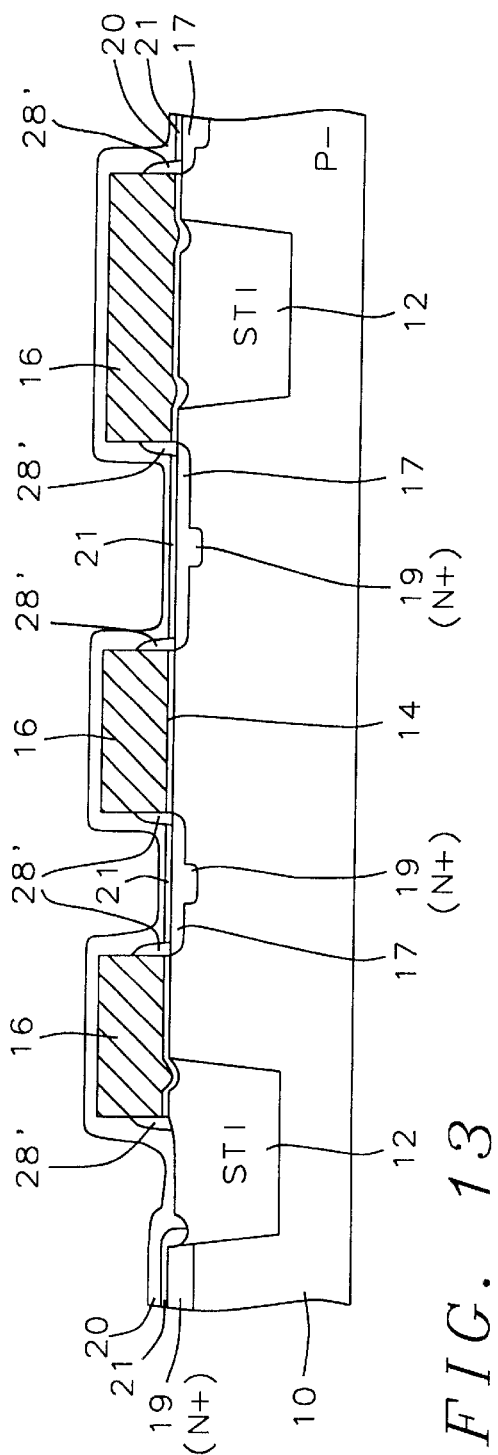

METHOD FOR MAKING BORDERLESS CONTACTS TO ACTIVE DEVICE REGIONS AND OVERLAYING SHALLOW TRENCH ISOLATION REGIONS

BACKGROUND OF THE INVENTION (1) Field of the Invention

The present invention relates to ultra large scale integrated (ULSI) circuits on semiconductor substrates, and more particularly relates to a method for forming reliable borderless contacts in the interlevel dielectric (ILD) layer over the active device area/shallow trench isolation interface.

(2) Description of the Prior Art

To continue increasing the circuit density on future Ultra Large Scale Integration (ULSI) circuits, downscaling is required on the semiconductor chips. This downscaling becomes increasingly difficult as the photolithography resolution improves and minimum feature sizes are reduced in the next generation of devices to deep submicrometer dimensions (e.g., 0.25 and 0.18 um). One method of increasing circuit density is to replace the conventional LOCOS (LOCal Oxidation of Silicon) isolation with a Shallow Trench Isolation (STI) that surrounds and electrically isolates the individual device areas on the silicon substrate. Briefly, the STI is formed by anisotropically etching trenches (with little etch bias) and filling the trenches with a chemical-vapor-deposited (CVD) oxide that is then etched back or chemically/mechanically polished (CMP) back to form a planar surface with the substrate. This replaces the LOCOS isolation which is formed by a thermal oxidation, which by its very nature, oxidizes laterally and intrudes on the device area. Another problem that limits the downscaling is the difficulty in making reliable borderless contacts to the device areas that overlap the STI to reduce the design rules (layout). When making the contact openings for the borderless contacts in an overlying ILD layer, overetching of the STI can result in exposing the shallow diffused junction in the substrate at the sidewall of the upper portion of the trench. The borderless contacts formed by a metal plug in the contact openings short the diffused junction to the substrate body destroying the intended circuit function. This borderless contact problem is best depicted in FIG. 1, in which a trench 2 containing an STI 12 is formed in a P$^-$ doped silicon substrate 10, and an N$^+$ shallow diffused contact 19(N$^+$) is formed in the substrate top surface. When an ILD layer 22 is deposited and a borderless contact opening 4 is etched, the STI 12 is overetched. A metal contact 24 formed in the opening 4 results in N$^+$ contact 19 shorting to the substrate 10 across the P/N junction at point A in the trench sidewall.

Several methods of overcoming these problems are depicted in the prior art drawings in FIGS. 2 through 5. FIG. 2 shows a portion of an FET gate electrode 16 with a gate oxide 14 and two STI regions 12. The STI 12 is formed having portion 12' extending above the surface of the substrate 10. Silicon nitride sidewall spacers 13 are then formed on the sidewalls of portions 12' by depositing and etching back a Si$_3$N$_4$ layer. Unfortunately, when the Si$_3$N$_4$ spacers 13 encroach onto the device-areas, as depicted for the STI 12 on the left, the design rules must be relaxed to provide the necessary area for the device, and therefore limits the device packing density. As shown for the STI 12 on the right, if the Si$_3$N$_4$ spacers do not extend over the interface at A, the STI can be overetched when the borderless contact openings are etched, causing electrical shorts between the shallow N$^+$ doped contacts 19 and the P$^-$ substrate. FIG. 3 shows another approach in which the STI 12 is recessed using a wet-etch dip, and a silicon nitride sidewall spacer 13 is formed by depositing and anisotropically etching back. After recessing the STI 12 and before forming the silicon nitride sidewall spacers 13, a polysilicon layer 16 is deposited and patterned to form gate electrodes 16 and concurrently to form polysilicon protective visors 15. However, these closely spaced polysilicon visors 15 can result in poor field isolation across the narrow STI 12 between adjacent device areas.

FIG. 4 shows a method in which the STI 12 is recessed and the Si$_3$N$_4$ visors 13' are formed when the Si$_3$N$_4$ layer is anisotropically etched back to form the sidewall spacers 13 on the gate electrode 16. However, in this method the gate oxide at point B under the gate electrode is eroded when the STI 12 is recessed by etching, and undercutting of the STI 12 at regions C during etching can result in peeling of the patterned polysilicon layer 16' and can result in thinning of the STI region. A similar method as depicted in FIG. 4 is described in the paper entitled "A 2.9 um$^2$ Embedded SRAM Cell with Co-Salicide Direct-Strap Technology for 0.18 um High Performance CMOS Logic" by K. Noda et al. in IEDM 97 of IEEE, pp. 847–850. Finally, a fourth method is shown in FIG. 5. In this approach a blanket Si$_3$N$_4$ layer is used to protect the interface A when the borderless contact openings are etched. However, the high stress due to the Si$_3$N$_4$ layer can cause dislocation in the substrate and high leakage currents at the N$^+$/P$^-$ junction between the N$^+$ contact 19 and the P$^-$ doped silicon substrate.

U.S. Pat. No. 4,981,813 to Bryant et al. describes a method for forming the conventional LOCOS with reduced bird's beak penetration into the active device area using silicon nitride spacers, thereby allowing increased circuit density. U.S. Pat. No. 5,173,444 to Kawamura describes a method similar to Bryant et al., also using silicon nitride sidewall spacers to reduce the bird's beak and increase circuit density. U.S. Pat. No. 5,652,176 to Maniar et al. uses a liner composed of aluminum nitride in the STI trench prior to filling the trench with SiO$_2$. When borderless contacts are etched over the source/drain area-STI interface, the aluminum nitride is retained on the sidewall of the trench and prevents shorting between the source/drain contact and P$^-$ substrate. Fazan et al. in U.S. Pat. No. 5,433,794 teach a method for making a sidewall spacer, composed of an insulating layer such as SiO$_2$ or Si$_3$N$_4$, on the sidewall of a raised STI. The insulating spacers overlap the active device regions and are used to reduce high electric fields (corner effect problem) that would cause device leakage currents. Cronin et al. in U.S. Pat. No. 4,944,682 teach a method for forming borderless contacts (self-aligned contacts) to polysilicon gate electrodes, but do not address borderless contacts to STI. U.S. Pat. No. 5,651,857 to Cronin et al. also teaches a method that form borderless contacts (self-aligned contacts) to polysilicon FET gate electrodes, but does not address making borderless contacts over source/drain areas-STI interfaces.

There is still a strong need in the semiconductor industry to provide improved borderless contacts to shallow diffused contact areas, such as FET source/drain areas on substrates, that also overlap STI without causing shorts between the shallow diffused contacts and the substrate.

SUMMARY OF THE INVENTION

It is a principal object of the present invention to provide borderless contacts to improve circuit density.

It is another object of this invention to provide a method for making more reliable borderless contacts that extend over the active device area/shallow trench isolation interface on a silicon substrate.

Still another object of this invention is to provide a silicon nitride visor (protective covering) on the edge of the active device region to prevent electrical shorting between the substrate and the diffused junction when borderless contacts are made.

A further object of this invention is to prevent erosion of the gate oxide when the shallow trench isolation is recessed for forming the visor.

In summary, these objectives are achieved by this invention, which forms reliable borderless contact openings to the silicon substrate that extend over the active device area/shallow trench isolation (STI) interface. More specifically, the method of a first embodiment utilizes a second silicon nitride ($Si_3N_4$) layer to form visors or protective coverings over the edge of the silicon active device areas to prevent electrical shorting of the diffused surface junctions to the substrate when borderless contacts are formed.

The invention begins by providing a semiconductor substrate. The most commonly used substrate in the semiconductor industry is composed of single crystal silicon. Active device areas are provided by etching trenches in the substrate and filling the trenches with a silicon oxide ($SiO_2$). The oxide is made planar with the substrate surface by various means. A gate oxide is grown on the active device areas, and a polysilicon layer (or a polycide layer) is deposited over the substrate and patterned to form FET gate electrodes over the active device areas. Lightly doped source/drain areas are formed by ion implantation to improve device performance of deep sub-micron devices. A conformal first $Si_3N_4$ layer is deposited and etched back to form sidewall spacers on the gate electrodes, and a second ion implantation is used to form source/drain contact areas.

During the formation of the STI and the patterning of the polysilicon layer, the interface between the active device areas and the STI can be electrically degraded, making it difficult to etch reliable borderless contacts in an insulating layer to the substrate. To achieve reliable interfaces while providing good borderless contacts, the invention consists of recessing the shallow trench isolation and exposing the upper portion of the sidewalls of the active device areas at the source/drain implanted junction while the $Si_3N_4$ sidewall spacers prevent the etching from attacking the gate oxide under the gate electrodes. The STI can be recessed using a controlled dip etch in hydrofluoric (HF) acid solution. A silicon oxide stress-release layer is formed over the edge of the active device areas on the substrate, for example by thermal oxidation. A conformal second $Si_3N_4$ layer is deposited and anisotropically etched back to form a visor to prevent the shallow source/drain implanted junctions from shorting to the substrate when the borderless contacts extend over the interface. It is now possible to deposit an interlevel dielectric (ILD) layer on the substrate and to etch in the ILD layer borderless contact openings to the active device areas that extend over the STI without causing source/drain-to-substrate shorting when metal plugs are formed in the contact openings.

By the method of a second embodiment, the $Si_3N_4$ spacers formed from the first $Si_3N_4$ layer are replaced with disposable $SiO_2$ spacers. A conformal $SiO_2$ layer is deposited and is etched back to form the spacers. The disposable spacers are removed at the same time that the STI is recessed using the HF dip etch. The remaining process steps are the same as in the first embodiment except that when the second $Si_3N_4$ layer is etched back to form the visor, the sidewall spacers on the gate electrodes are also formed. In the second embodiment, the source/drain implants can be implemented first before the removal of the disposable $SiO_2$ spacers, and the lightly doped drain (LDD) implant can be performed after the removal of the disposable $SiO_2$ sidewall spacers and prior to forming the visor and $Si_3N_4$ sidewall spacers.

BRIEF DESCRIPTION OF THE DRAWINGS

The objects and other advantages of this invention are best understood with reference to the preferred embodiment when read in conjunction with the following drawings.

FIGS. 1 through 5 show prior-art schematic cross-sectional views of shallow trench structures on substrates for various schemes used to protect the edge of the active device region at the STI interface for preventing degradation of the electrical junctions between the shallow diffused junctions and the substrate when borderless contact openings are etched.

FIGS. 6 through 10 show schematic cross-sectional views for the sequence of process steps, by a first embodiment, for making borderless contacts while protecting with a visor the active device areas/STI interface from electrical degradation and also preventing the gate oxide from being etched.

FIGS. 11 through 15 show schematic cross-sectional views for the sequence of process steps, by a second embodiment, that uses disposable sidewall spacers to achieve the same desirable results as in the first embodiment.

DESCRIPTION OF THE PREFERRED EMBODIMENTS

Figure 8:
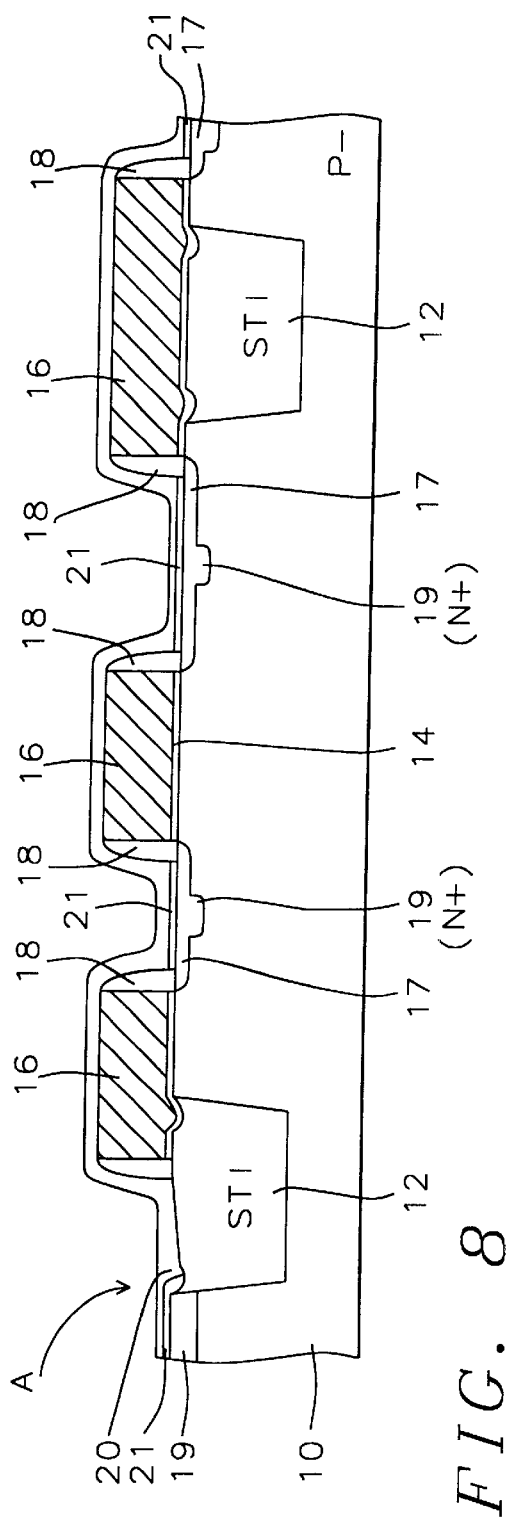

The method of the present invention is now described in detail for making improved borderless contacts in an inter-level dielectric (ILD) layer to the active device areas on an underlying silicon substrate. The borderless contacts can be made extending over the shallow trench isolation (STI) without causing electrical shorts between the shallow diffused junctions in the active device regions at the STI interface. This allows for tighter design ground rules that improve the circuit density on the substrate for future semiconductor technologies having minimum feature sizes of 0.18 micrometers (um). The method is particularly useful for making integrated circuits using field effect transistors (FETs) that have gate electrodes on the active device regions and extending over shallow trench regions, and is also useful for making dynamic random access memory (DRAM) cells having reduced area.

Referring now to FIG. 6, the method begins by providing a semiconductor substrate 10 on which are formed FETs. The substrate 10 is preferably a single-crystal silicon having a <100> crystallographic orientation. The shallow trench isolation (STI) regions can be formed by a variety of method commonly used in the industry. Although the detailed steps are not shown in the Figs., one method is to use a hard-mask, such as a $Si_3N_4$ layer that is patterned using photolithographic techniques to leave portions over the active device areas. Anisotropic plasma etching is then used to etch trenches 2 in the shallow trench regions on the substrate. For example, the trenches are etched using reactive ion etching (RIE) using an etchant gas such as hydrogen bromide (HBr) or a chlorine-based gas. Typically the trenches 2 are etched to a depth of between about 2000 and 5000 Angstroms. After growing a thin thermal oxide, the trenches are filled with a chemical-vapor-deposited (CVD) $SiO_2$ and are polished back or etched back to form an essentially planar surface, as depicted in FIG. 6. Continuing, a gate oxide 14 is grown on the active device areas. One method of forming the gate oxide is to thermally oxidize the substrate in an oxygen furnace. The gate oxide 14 is grown to a thickness of between about 40 and 200 Angstroms.

Still referring to FIG. 6, a polysilicon layer 16 is deposited over the substrate by low pressure chemical vapor deposition (LPCVD) using silane ($SiH_4$) as the reactant gas. The polysilicon layer 16 deposited to a preferred thickness of between about 500 and 2000 Angstroms, and is doped with a conductive type dopant to a concentration of between about 1.0 E 19 and 1.0 E 21 atoms/$cm^3$. For example, N-channel FETs for DRAM cells can be doped with phosphorus (P), and P-channel FETs for CMOS circuits can be doped with boron (B). Layer 16 is then patterned to form FET gate electrodes 16 over the active device areas and local interconnections such as the word lines for DRAM circuits. Alternatively, layer 16 can be a polycide layer having tungsten silicide ($WSi_2$) layer on the top surface of the polysilicon layer to reduce electrical resistance and to improve circuit performance. Next, lightly doped source/drain areas 17($N^-$) are formed by ion implantation to minimize adverse short-channel effects on deep submicron devices, for example, FETs having channel lengths of about 0.18 micrometers (um). Typically the lightly doped source/drain areas are doped to a final concentration of between about 1.0 E 18 and 1.0 E 19 atoms/$cm^3$.

Continuing with FIG. 6, a thin stress-release oxide layer (not shown) is formed, having a thickness of about 50 Angstroms, prior to depositing a $Si_3N_4$ layer. A conformal first $Si_3N_4$ layer 18 is deposited and etched back to form sidewall spacers 18 on the gate electrodes 16. Layer 18 is preferably deposited by LPCVD using, for example, dichlorosilane ($SiCl_2H_2$) and ammonia ($NH_3$) as the reactant gas mixture. Layer 18 is typically deposited to a thickness of between about 500 and 1500 Angstroms, and is etched back to form sidewall spacers having a width W of about 500 and 1500 Angstroms on the sidewalls of the gate electrodes 16. The etch-back is carried out using anisotropic plasma etching in a high-density plasma (HDP) etcher using an etchant gas such as sulfur hexafluoride ($SF_6$) that etches the $Si_3N_4$ selectively to the underlying silicon substrate 10. A second ion implantation is then used to form source/drain contact areas 19($N^+$) having a final concentration of between about 1.0 E 19 and 1.0 E 21 atoms/$cm^3$.

During the formation of the STI and the patterning of the polysilicon layer 16, the interface, shown as A in FIG. 6, between the active device areas and the STI 12 can be electrically degraded. This makes it difficult to etch reliable borderless contacts in an overlying insulating layer to the substrate without shorting the shallow diffused junctions, such as the $N^+$ source/drain areas to the substrate.

Referring now to FIG. 7 and by the method of this invention, more reliable interfaces A are achieved. The method consists or utilizing a $SiO_2$ dip etch to recess the shallow trench isolation 12 to a point X below the surface of the substrate 10 and to expose the upper portion of the sidewalls of the active device areas at the interface A. Preferably the recessing is carried out using a controlled hydrofluoric (HF) acid etch or a HF vapor etch to remove about 500 to 1000 Angstroms. The $Si_3N_4$ sidewall spacers 18, being sufficiently wide, prevent the etching from reaching the gate oxide 14 under the gate electrodes 16, that would otherwise occur. For example, the method described for forming visors in "A 2.9 $um^2$ Embedded SRAM Cell with Co-Salicide Direct-Strap Technology for 0.18 um High Performance CMOS Logic" by K. Noda et al. in IEDM 97 of IEEE, pp. 847–850 etches the STI by about 400 Angstroms prior to forming $Si_3N_4$ sidewall spacers and visors, and therefore the etching would also etch the gate oxide under the gate electrode.

Referring to FIG. 8, a $SiO_2$ stress-release layer 21 is formed on the exposed surface of the substrate and over the edge of the active device areas. Preferably the stress-release layer is formed by thermal oxidation to a thickness of at least 50 Angstroms. Next, a conformal second $Si_3N_4$ layer 20 is deposited, for example by LPCVD to a preferred thickness of between about 500 and 1500 Angstroms.

Figure 9:
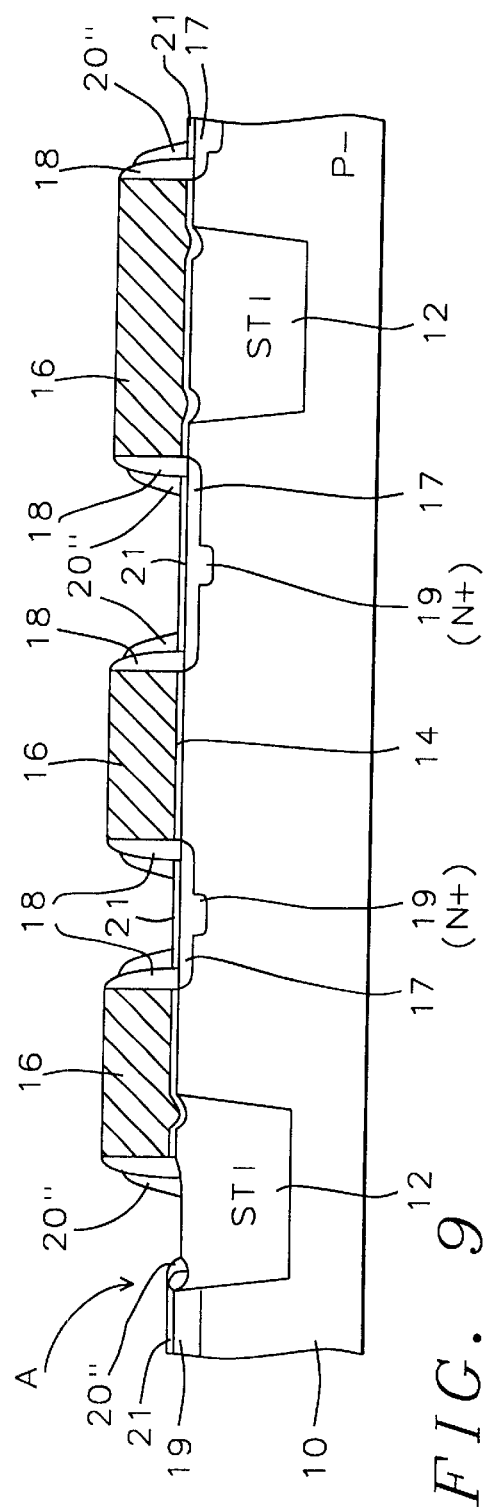

Referring to FIG. 9, the second $Si_3N_4$ layer 20 is anisotropically etched back to form a visor 20' (protective covering) to prevent the shallow source/drain implanted junctions from shorting to the substrate when the borderless contacts, formed at a later step, extend over the interface A. Also, portions of the $Si_3N_4$ layer 20 are formed on the sidewall spacers 18'.

Figure 10:
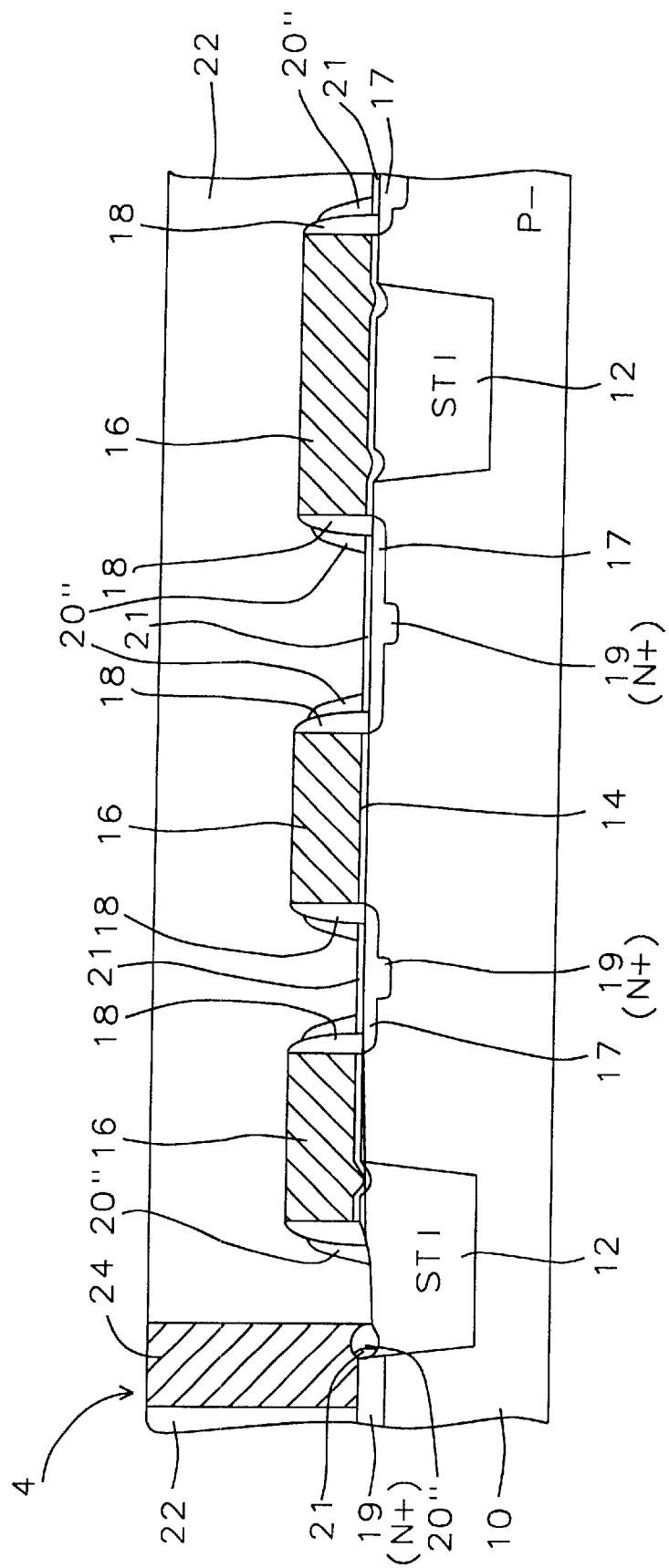

Referring to FIG. 10, an interlevel dielectric (ILD) layer 22 is deposited on the substrate over the active device areas. Preferably layer 22 is a $SiO_2$ deposited, for example, by CVD to a thickness of between about 5000 and 10000 Angstroms. Openings 4 are etched to the active device areas for contacts. The openings 4 can now be borderless contact openings that also extend over the STI to provide increased circuit density by utilizing tighter ground rules. The openings 4 are preferably etched using an anisotropic plasma etching that selectively etches the oxide 22 to the silicon substrate 10 and to the $Si_3N_4$ visor 20'. The etching is carried out preferably using HDP and a fluorine-based etchant gas. Since the $Si_3N_4$ visor 20' protects the shallow diffused junctions, such as the source/drain contact areas 19($N^+$) for the FETs, it is possible now to deposit a conducting material 24, such as a metal, to fill the openings 4 without causing electrical shorts.

Referring now to FIGS. 11 through 15, a second embodiment is described. This embodiment is similar to the first embodiment, and therefore all similar elements of the structure are numbered the same.

Figure 11:
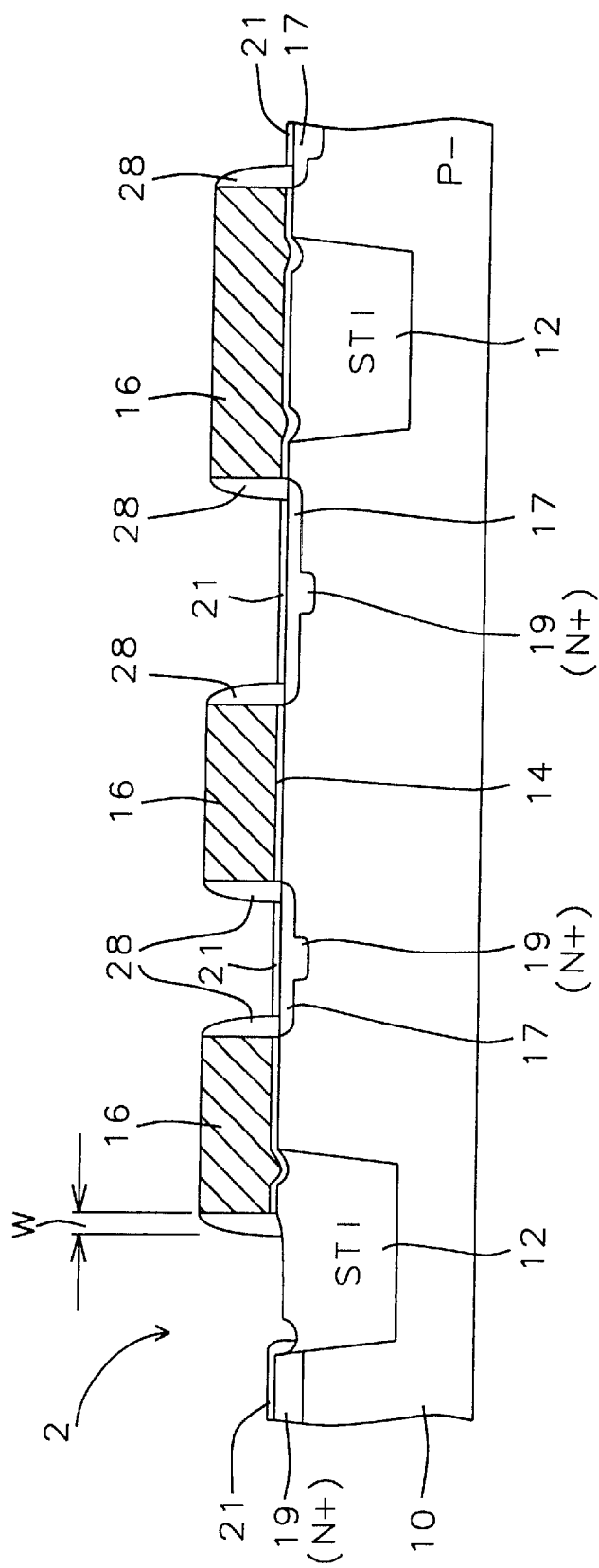

Referring to FIG. 11, disposable $SiO_2$ sidewall spacers 28 are used in place of the $Si_3N_4$ sidewall spacers 18 of the first embodiment (FIG. 6). The $SiO_2$ spacers 28 are formed by depositing a conformal CVD $SiO_2$ layer and etching back using anisotropic plasma etching to form spacers having a width W, which is between about 500 and 1500 Angstroms. Since major portions of the spacers 28 are removed at a later step, the lightly doped source/drain regions 17($N^-$) can also be implanted at a later step.

Referring to FIG. 12, the STI 12 is recessed to a depth of about 500 to 1000 Angstroms, similar to the first embodiment, by using a controlled HF acid etch or a HF vapor etch. This etching step also removes portions of the disposable $SiO_2$ spacers 28 at the same time, while the $SiO_2$ sidewall spacers protect the gate oxide 14 from being etched. During recessing of the STI 12, sidewall portions 28' of the $SiO_2$ sidewall spacers 28 may remain, as shown in FIGS. 12–15. Optionally, since the disposable sidewall spacers 28 are removed, the lightly doped drains 17($N^-$) can be implanted after the source/drain contact areas 19($N^+$) are implanted.

Figure 14:
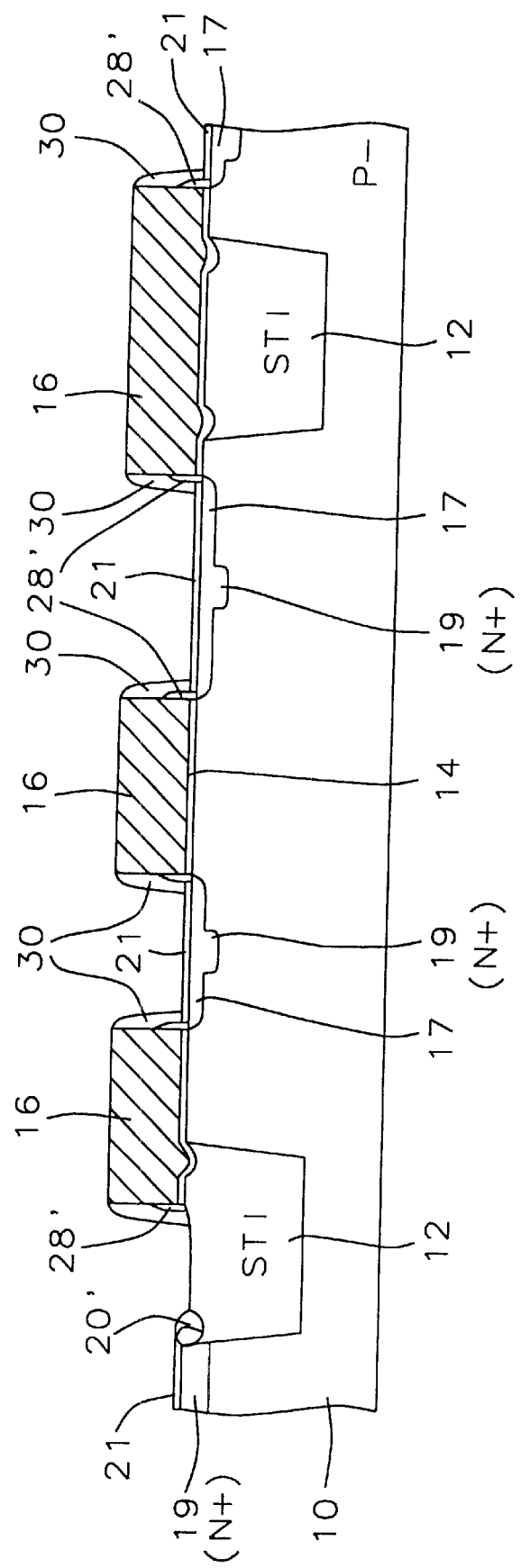

Referring to FIG. 13, the process is similar to the first embodiment. A silicon nitride layer 20 is deposited and is anisotropically etched back, as shown in FIG. 14, to form visors 20' and concurrently to form new $Si_3N_4$ sidewall spacers 30 on the gate electrodes 16.

Figure 15:
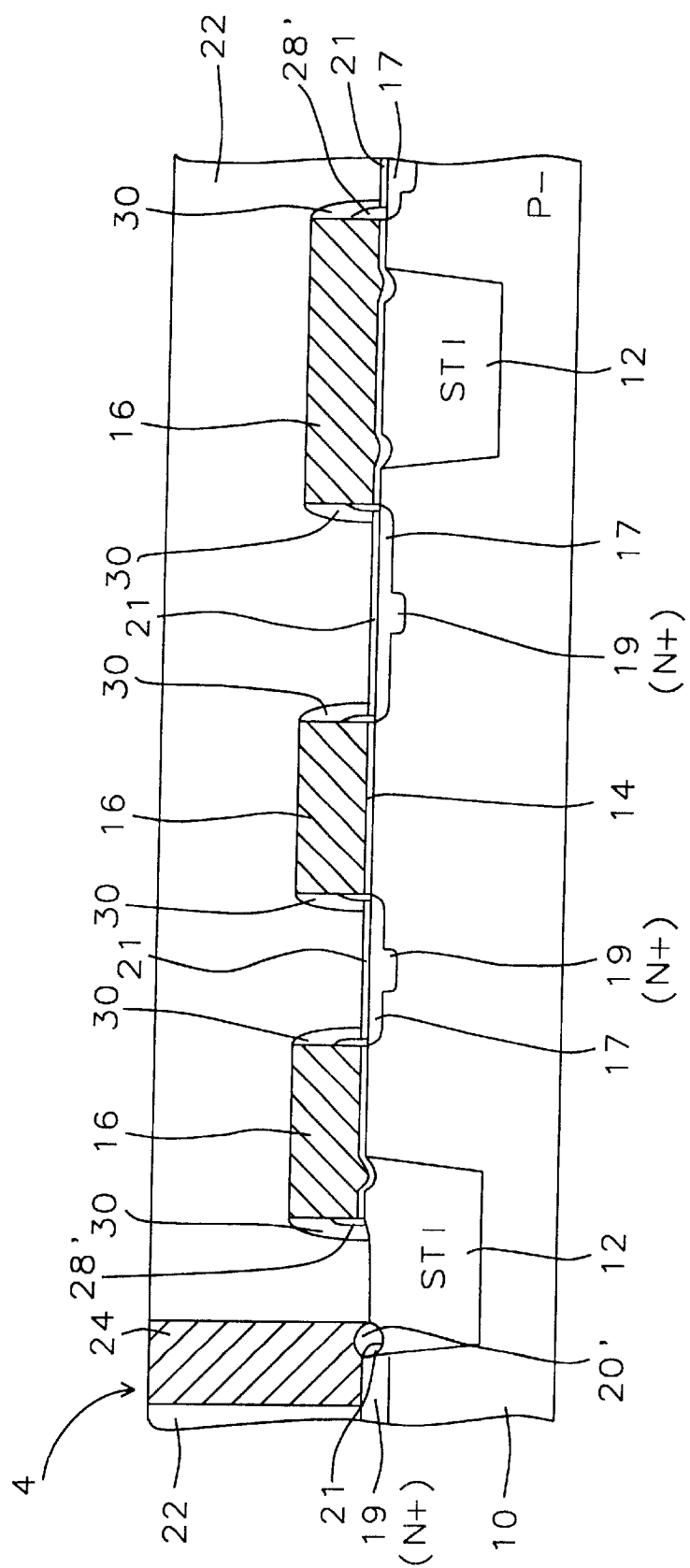

As shown now in FIG. 15, the ILD layer 22 is deposited as in the first embodiment. Contact openings 4 can be etched in the ILD layer 22. The contact openings can overlap the interface A that has the visor 20', by the method of this invention. The visor 20' protects the shallow diffused junction 19(N$^+$) from shorting to the substrate 10 when the contact openings are filled with a metal 24.

While the invention has been particularly shown and described with reference to the preferred embodiment thereof, it will be understood by those skilled in the art that various changes in form and details may be made without departing from the spirit and scope of the invention.

What is claimed is:

1. A method for making borderless contacts for integrated circuits on a semiconductor substrate comprising the steps of:

providing said semiconductor substrate having active device areas adjacent to shallow trench isolation;

forming a gate oxide on said active device areas;

depositing a polysilicon layer over said substrate;

patterning said polysilicon layer by photoresist masking and plasma etching to form gate electrodes for field effect transistors over said active device areas, wherein said etching electrically degrades the exposed interface between said active device areas and said shallow trench isolation;

forming lightly doped source/drain areas by ion implantation;

depositing a conformal first silicon nitride layer and etching back to form sidewall spacers on said gate electrodes;

forming source/drain contact areas by ion implantation;

recessing said shallow trench isolation and exposing sidewalls of said active device areas;

forming a silicon oxide stress-release layer on said substrate;

depositing a conformal second silicon nitride layer and anisotropically etching back to form a visor on said sidewalls of said active device areas;

depositing an interlevel dielectric layer on said substrate;

etching contact openings in said interlevel dielectric layer to said substrate and extending over said shallow trench isolation, wherein said visor provides a protective covering to prevent electrical shorting of said source/drain contact areas to said substrate.

2. The method of claim 1, wherein said shallow trench isolation is composed of silicon oxide and is recessed in said substrate to a depth of between about 2000 and 5000 Angstroms.

3. The method of claim 1, wherein said gate oxide is formed to a thickness of between about 40 and 200 Angstroms.

4. The method of claim 1, wherein said polysilicon layer is conductively doped, and is deposited to a thickness of between about 500 and 2000 Angstroms.

5. The method of claim 1, wherein said first silicon nitride layer is deposited to a thickness of between about 500 and 1500 Angstroms.

6. The method of claim 1, wherein said recessing of said shallow trench isolation is to a depth of between about 500 and 1000 Angstroms.

7. The method of claim 1, wherein said silicon oxide stress-release layer is at least 50 Angstroms thick.

8. The method of claim 1, wherein said second silicon nitride layer is deposited to a thickness of between about 500 and 1500 Angstroms.

9. The method of claim 1, wherein said interlevel dielectric layer is composed of silicon oxide and is deposited to a thickness of between about 5000 and 10000 Angstroms.

10. The method of claim 1, wherein said etching of said contact openings in said interlevel dielectric layer has an etch-rate selectivity of silicon oxide to silicon nitride of at least greater than 10:1.

11. A method for making borderless contacts for integrated circuits on a semiconductor substrate comprising the steps of:

providing said semiconductor substrate having active device areas adjacent to shallow trench isolation;

forming a gate oxide on said active device areas;

depositing a polysilicon layer over said substrate;

patterning said polysilicon layer by photoresist masking and plasma etching to form gate electrodes for field effect transistors over said active device areas, wherein said etching electrically degrades the exposed interface between said active device areas and said shallow trench isolation;

forming lightly doped source/drain areas by ion implantation;

depositing a conformal silicon oxide layer and etching back to form disposable sidewall spacers on said gate electrodes;

forming source/drain contact areas by ion implantation;

recessing said shallow trench isolation and exposing sidewalls of said active device areas, and concurrently removing said disposable sidewall spacers;

forming a silicon oxide stress-release layer on said substrate;

depositing a conformal silicon nitride layer and anisotropically etching back to form a visor on said sidewalls of said active device areas, and concurrently forming silicon nitride sidewall spacers on said gate electrodes;

depositing an interlevel dielectric layer on said substrate;

etching contact openings in said interlevel dielectric layer to said substrate and extending over said shallow trench isolation, wherein said visor provides a protective covering to prevent electrical shorting of said source/drain contact areas to said substrate.

12. The method of claim 11, wherein said shallow trench isolation is composed of silicon oxide and is recessed in said substrate to a depth of between about 2000 and 5000 Angstroms.

13. The method of claim 11, wherein said gate oxide is formed to a thickness of between about 40 and 200 Angstroms.

14. The method of claim 11, wherein said polysilicon layer is conductively doped, and is deposited to a thickness of between about 500 and 2000 Angstroms.

15. The method of claim 11, wherein said silicon oxide layer is deposited to a thickness of between about 1000 and 2000 Angstroms.

16. The method of claim 11, wherein said recessing of said shallow trench isolation is to a depth of between about 500 and 1000 Angstroms.

17. The method of claim 11, wherein said silicon oxide stress-release layer is at least 50 Angstroms thick.

18. The method of claim 11, wherein said silicon nitride layer is deposited to a thickness of between about 500 and 1500 Angstroms.

19. The method of claim 11, wherein said interlevel dielectric layer is composed of silicon oxide and is deposited to a thickness of between about 5000 and 10000 Angstroms.

20. The method of claim 11, wherein said etching of said contact openings in said interlevel dielectric layer has an etch-rate selectivity of silicon oxide to silicon nitride of at least greater than 10:1.

21. A method for making borderless contacts for integrated circuits on a semiconductor substrate comprising the steps of:

providing said semiconductor substrate having active device areas adjacent to shallow trench isolation;

forming a gate oxide on said active device areas;

depositing a polysilicon layer over said substrate;

patterning said polysilicon layer by photoresist masking and plasma etching to form gate electrodes for field effect transistors over said active device areas, wherein said etching electrically degrades the exposed interface between said active device areas and said shallow trench isolation;

depositing a conformal silicon oxide layer and etching back to form disposable sidewall spacers on said gate electrodes;

forming source/drain contact areas by ion implantation;

recessing said shallow trench isolation and exposing sidewalls of said active device areas, and concurrently removing said disposable sidewall spacers;

forming lightly doped source/drain areas by ion implantation;

forming a silicon oxide stress-release layer on said substrate;

depositing a conformal silicon nitride layer and anisotropically etching back to form a visor on said sidewalls of said active device areas, and concurrently forming silicon nitride sidewall spacers on said gate electrodes;

depositing an interlevel dielectric layer on said substrate;

etching contact openings in said interlevel dielectric layer to said substrate and extending over said shallow trench isolation, wherein said visor provides a protective covering to prevent electrical shorting of said source/drain contact areas to said substrate.

22. The method of claim 21, wherein said shallow trench isolation is composed of silicon oxide and is recessed in said substrate to a depth of between about 2000 and 5000 Angstroms.

23. The method of claim 21, wherein said gate oxide is formed to a thickness of between about 40 and 200 Angstroms.

24. The method of claim 21, wherein said polysilicon layer is conductively doped, and is deposited to a thickness of between about 500 and 2000 Angstroms.

25. The method of claim 21, wherein said silicon oxide layer is deposited to a thickness of between about 1000 and 2000 Angstroms.

26. The method of claim 21, wherein said recessing of said shallow trench isolation is to a depth of between about 500 and 1000 Angstroms.

27. The method of claim 21, wherein said silicon oxide stress-release layer is at least 50 Angstroms thick.

28. The method of claim 21, wherein said silicon nitride layer is deposited to a thickness of between about 500 and 1500 Angstroms.

29. The method of claim 21, wherein said interlevel dielectric layer is composed of silicon oxide and is deposited to a thickness of between about 5000 and 10000 Angstroms.

30. The method of claim 21, wherein said etching of said contact openings in said interlevel dielectric layer has an etch-rate selectivity of silicon oxide to silicon nitride of at least greater than 10:1.

* * * * *